(12) United States Patent
Ulmer et al.

(10) Patent No.: US 6,505,665 B1
(45) Date of Patent: Jan. 14, 2003

(54) METHOD AND APPARATUS FOR USE IN ASSEMBLING ELECTRONIC DEVICES

(75) Inventors: Kenneth R. Ulmer, Brazoria, TX (US); Cuong Van Pham, Belleville, MI (US)

(73) Assignee: Intermedics, Inc., Angleton, TX (US)

( * ) Notice: Subject to any disclaimer, the term of this patent is extended or adjusted under 35 U.S.C. 154(b) by 0 days.

(21) Appl. No.: 09/154,810

(22) Filed: Sep. 17, 1998

(51) Int. Cl.[7] ............................................. B31B 31/00
(52) U.S. Cl. ...................................... 156/556; 156/382
(58) Field of Search ................................ 156/382, 538, 156/539, 556, 559, 560, 578

(56) References Cited

U.S. PATENT DOCUMENTS

| | | | |
|---|---|---|---|
| 3,584,741 A | * 6/1971 | Schimer ...................... 209/559 |
| 3,887,998 A | 6/1975 | Hartleroad et al. ........... 29/589 |
| 3,992,236 A | 11/1976 | Wanesky ..................... 156/83 |
| 4,015,764 A | 4/1977 | Durney ....................... 277/118 |
| 4,063,050 A | 12/1977 | Carlson et al. ........... 179/111 E |
| 4,115,735 A | * 9/1978 | Stanford ..................... 324/757 |
| 4,127,432 A | 11/1978 | Kuwano et al. ............. 156/297 |
| 4,283,847 A | 8/1981 | May ........................... 29/832 |
| 4,312,692 A | 1/1982 | Ikeda et al. ................. 156/272 |
| 4,343,088 A | 8/1982 | Farley et al. ................. 30/273 |
| 4,375,126 A | 3/1983 | Düll et al. .................... 29/740 |
| 4,381,601 A | 5/1983 | Tamai et al. .................. 29/740 |
| 4,451,324 A | * 5/1984 | Ichikawa et al. ........ 156/299 X |
| 4,474,639 A | * 10/1984 | Fritz ...................... 156/299 X |
| 4,479,298 A | * 10/1984 | Hug ........................... 29/589 |
| 4,489,487 A | 12/1984 | Bura ........................... 29/840 |
| 4,635,346 A | * 1/1987 | Matsuzaki .................... 29/577 |
| 4,667,155 A | * 5/1987 | Coiner et al. ................ 324/757 |
| 4,667,868 A | 5/1987 | Decker et al. ............. 228/49.1 |
| 4,783,695 A | 11/1988 | Eichelberger et al. ........ 357/65 |
| 4,785,936 A | 11/1988 | Shpigelman ................. 206/454 |
| 4,803,424 A | * 2/1989 | Ierardi et al. ............... 324/757 |
| 4,870,354 A | * 9/1989 | Davaut ....................... 324/757 |
| 4,880,486 A | * 11/1989 | Maeda ..................... 156/273.5 |
| 4,881,356 A | 11/1989 | Beezer et al. .................. 53/53 |
| 4,893,403 A | * 1/1990 | Heflinger et al. ............. 29/840 |
| 4,903,393 A | 2/1990 | Higuchi ....................... 29/450 |
| 4,908,092 A | 3/1990 | Koibuchi .................... 156/556 |
| 4,918,811 A | 4/1990 | Eichelberger et al. ......... 29/840 |
| 4,941,255 A | * 7/1990 | Bull ............................ 29/833 |
| 4,345,371 A | * 8/1990 | Ohsawa et al. ............... 29/836 |
| 4,953,283 A | 9/1990 | Kawabata et al. ............ 29/593 |
| 4,959,749 A | 9/1990 | Dzarnoski, Jr. et al. ..... 361/396 |
| 4,980,002 A | 12/1990 | Dzarnoski, Jr. et al. ...... 156/64 |
| 4,985,107 A | * 1/1991 | Conroy et al. .............. 156/299 |
| 4,990,462 A | 2/1991 | Sliwa, Jr. ..................... 437/51 |
| 4,999,311 A | 3/1991 | Dzarnoski, Jr. et al. ...... 437/51 |
| 5,054,193 A | * 10/1991 | Ohms et al. ................... 29/840 |
| 5,056,296 A | 10/1991 | Ross et al. ..................... 53/478 |
| 5,058,721 A | 10/1991 | Koibuchi ................. 198/345.1 |
| 5,075,253 A | 12/1991 | Sliwa, Jr. .................... 437/209 |
| 5,135,098 A | 8/1992 | Koibuchi ................. 198/345.1 |
| 5,136,238 A | 8/1992 | Kade ..................... 324/158 F |

(List continued on next page.)

OTHER PUBLICATIONS

Zarrow, Phil, "Printing", Special Supplement, SMT (Surface Mount Technology), Jul. 1998, pp. 16–19.

van der Bosch, Ann; DeBaros, Toney; "Adhesives/Epoxies and Dispensing", Special Supplement, SMT (Surface Mount Technology), Jul. 1998, pp. 20–25.

*Primary Examiner*—Francis J. Lorin
(74) *Attorney, Agent, or Firm*—Schwegman, Lundberg, Woessner & Kluth, P.A.

(57) ABSTRACT

A first fixture holds a plurality of circuit components backside up in a substantially coplanar relationship. An adhesive applying device, such as screen printer, applies adhesive to the backside of each circuit component. A second fixture is aligned with and placed on the first fixture. The fixtures are then flipped so that the circuit components are supported in a right side up position by the second fixture. A device such as a pick and place machine, may then be used to transfer the circuit components from the second fixture to a substrate.

46 Claims, 10 Drawing Sheets

U.S. PATENT DOCUMENTS

| | | | |
|---|---|---|---|
| 5,138,430 A | 8/1992 | Gow, 3rd et al. | 357/70 |
| 5,144,747 A | 9/1992 | Eichelberger | 29/839 |
| 5,158,640 A | 10/1992 | Akiyama et al. | 156/542 |
| 5,161,984 A | 11/1992 | Taylor et al. | 439/73 |
| 5,218,753 A | 6/1993 | Suzuki et al. | 29/740 |
| 5,221,215 A | 6/1993 | Tan et al. | 439/620 |
| 5,250,843 A | 10/1993 | Eichelberger | 257/692 |
| 5,286,679 A * | 2/1994 | Farnworth et al. | 437/209 |
| 5,362,681 A | 11/1994 | Roberts, Jr. et al. | 437/226 |
| 5,366,906 A | 11/1994 | Wojnarowski e al. | 437/8 |
| 5,367,766 A | 11/1994 | Burns et al. | 29/848 |
| 5,396,186 A * | 3/1995 | Scheutzow | 324/754 |
| 5,424,918 A | 6/1995 | Felps et al. | 361/704 |
| 5,437,041 A | 7/1995 | Wakabayashi et al. | 395/800 |
| 5,446,620 A | 8/1995 | Burns et al. | 361/704 |
| 5,458,715 A * | 10/1995 | Takeuchi et al. | 156/241 |
| 5,504,988 A | 4/1996 | Avery et al. | 29/741 |
| 5,519,332 A | 5/1996 | Wood et al. | 324/755 |
| 5,550,711 A | 8/1996 | Burns et al. | 361/728 |
| 5,581,443 A | 12/1996 | Nakamura et al. | 361/705 |
| 5,615,086 A | 3/1997 | Collins et al. | 361/704 |
| 5,620,927 A | 4/1997 | Lee | 29/841 |
| 5,642,261 A | 6/1997 | Bond et al. | 361/704 |
| 5,659,459 A | 8/1997 | Wakabayashi et al. | 361/753 |
| 5,667,129 A | 9/1997 | Morita et al. | 361/753 |
| 5,670,009 A * | 9/1997 | Tarn et al. | 156/299 |
| 5,708,297 A | 1/1998 | Clayton | 257/723 |
| 5,731,633 A | 3/1998 | Clayton et al. | 257/723 |
| 5,751,553 A | 5/1998 | Clayton | 361/749 |
| 5,776,799 A * | 7/1998 | Song et al. | 438/118 |
| 5,811,879 A * | 9/1998 | Akran | 257/723 |
| 5,875,068 A | 2/1999 | Sawada | 360/99.01 |
| 5,881,453 A | 3/1999 | Avery et al. | 29/834 |
| 5,932,065 A * | 8/1999 | Mitchell | 156/556 |
| 5,953,588 A | 9/1999 | Camien et al. | 438/106 |
| 5,959,840 A | 9/1999 | Collins et al. | 361/713 |
| 5,983,644 A | 11/1999 | Bolandi et al. | 62/3.2 |
| 6,017,776 A * | 1/2000 | Jiang et al. | 438/118 |
| 6,136,128 A * | 10/2000 | Chung | 156/235 |
| 6,204,093 B1 * | 3/2001 | Ahmad | 438/119 |

* cited by examiner

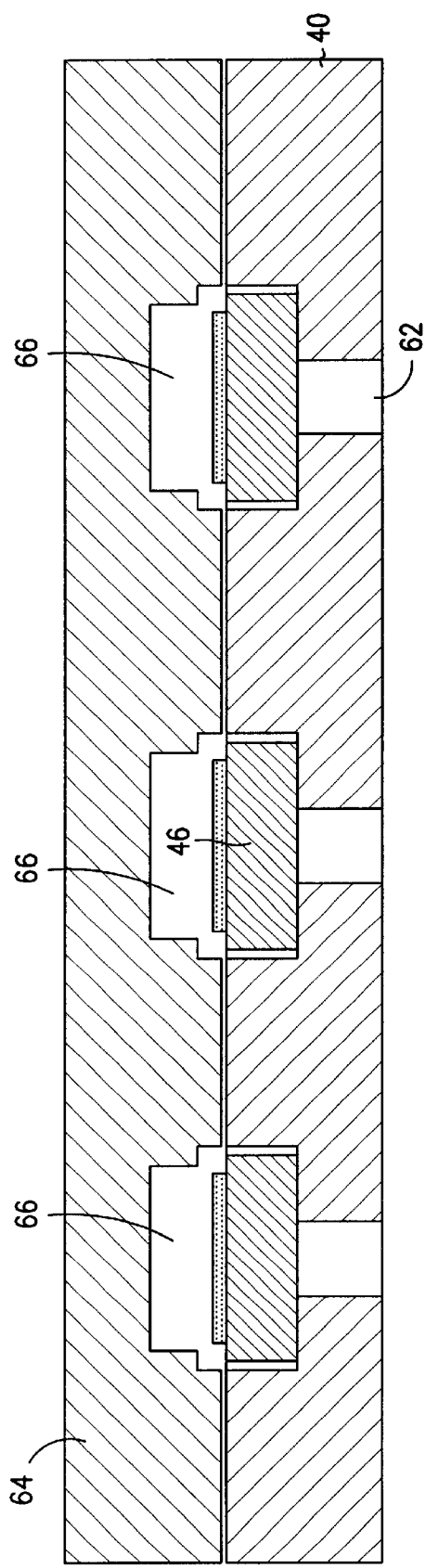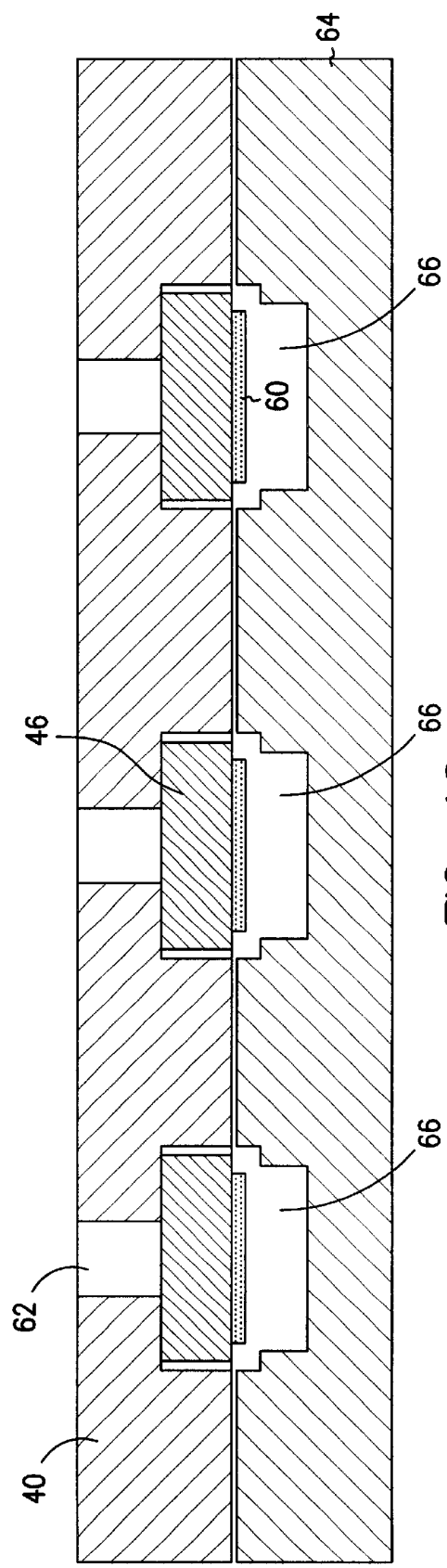
FIG. 9
FIG. 10

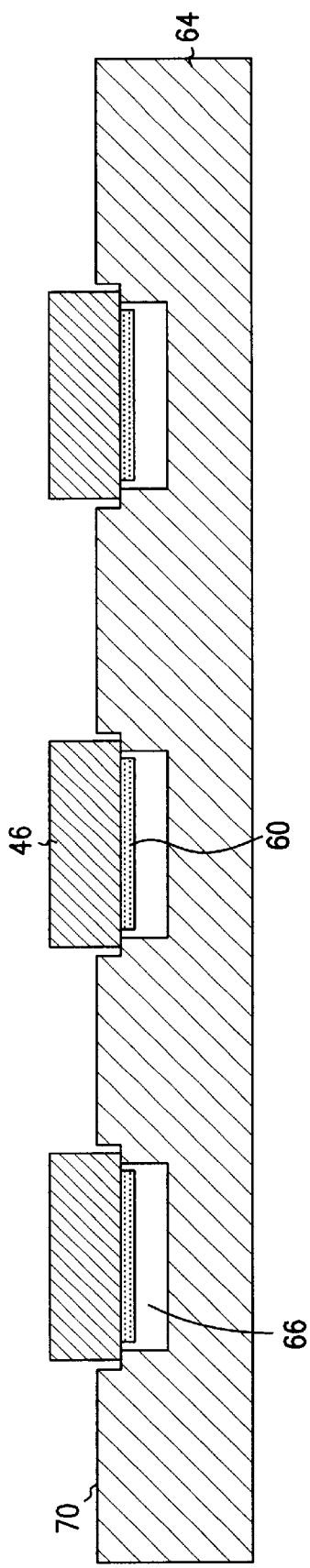
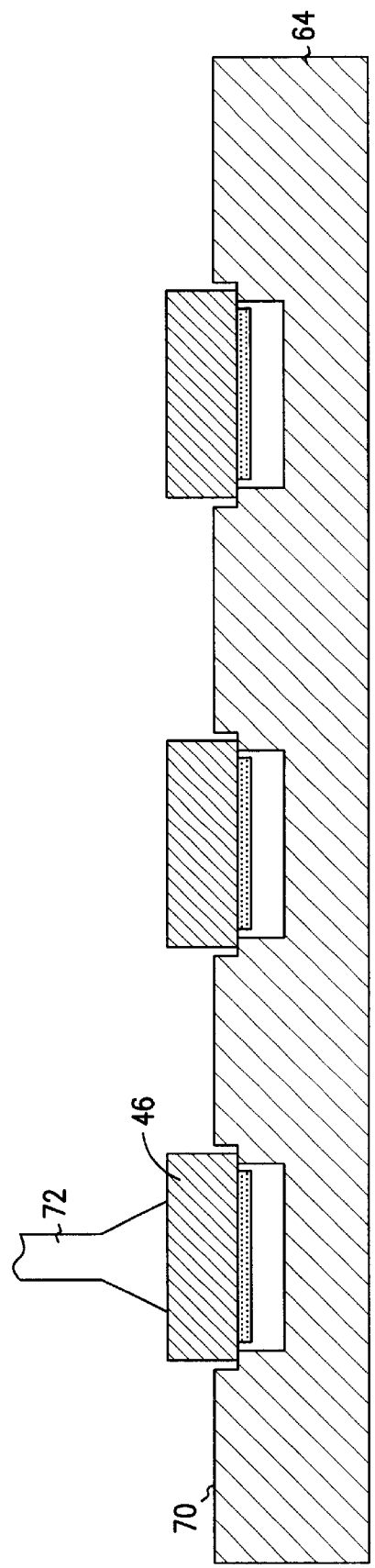

METHOD AND APPARATUS FOR USE IN ASSEMBLING ELECTRONIC DEVICES

CROSS-REFERENCE TO RELATED APPLICATIONS

The present invention is related to the following application which are incorporated herein by reference:

U.S. patent application Ser. No. 09/160,202, filed Sep. 17, 1998, titled "METHOD AND APPARATUS FOR USE IN ASSEMBLING ELECTRONIC DEVICES", and U.S. patent application Ser. No. 09/667,943, filed Sep. 22, 2000, titled "METHOD AND APPARATUS FOR USE IN ASSEMBLING ELECTRONIC DEVICES".

FIELD OF THE INVENTION

The present invention relates generally to circuit fabrication and, more particularly, to methods and apparatus for coupling integrated circuit chips and the like to a substrate.

BACKGROUND OF THE RELATED ART

In the fabrication of electrical circuits, it is often desirable to couple a circuit component to a substrate. For instance, one particular example involves the coupling of an integrated circuit chip to a ceramic substrate or to a printed circuit board. Although various techniques exist, adhesives are widely used to couple circuit components to substrates.

Conventional fabrication techniques apply adhesive to the substrate. The circuit components are then placed onto the adhesive on the substrate. One popular and very efficient method for applying adhesive onto a substrate is referred to as a screen printing process. In a screen printing process, a screen that is generally impermeable to adhesive has adhesive placed on it. The screen includes a pattern of holes formed in it, and these holes correspond to desired locations of circuit components on the substrate. When the screen pattern is placed over the substrate, a squeegee moves along the screen and over the holes, so that the adhesive passes through the holes and onto the underlying substrate.

The screen printing process works quite well on substrates that are substantially flat, and it provides a relatively flat adhesive patch that corresponds to the shape of the circuit component to be placed on the substrate. However, the screen printing process does not work well on multi-level substrates or on substrates that include ridges or cavities. On substrates with such surface irregularities, it is difficult for the screen to remain in contact with the substrate as the squeegee passes over the screen. As a result, the adhesive may not be properly transferred from the screen to the substrate.

To deposit adhesive on non-flat substrates, dispensing machines are typically used. Dispensing machines use a plurality of needles to dispense drops of adhesive onto a substrate at the desired locations. Although dispensing machines are able to deposit adhesive on non-flat substrates, such machines unfortunately exhibit various other disadvantages. First, dispensing machines deposit drops of adhesive, rather than carefully formed and relatively flat adhesive patterns such as those produced by screen printing. When circuit components are placed on these drops, the adhesive may not distribute evenly between the component and the substrate. Second, dispensing machines are relatively slow compared to screen printing machines. As is well known, slower techniques tend to limit throughput and increase manufacturing costs. Third, certain very desirable adhesives cannot be dispensed by dispensing machines due to their physical and/or chemical properties.

The present invention may address one or more of the problems discussed above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided an apparatus for use in assembling an electronic device. The apparatus includes a fixture that has a substantially regular surface. The substantially regular surface has a plurality of recesses therein. Each of the plurality of recesses are sized to accept a circuit component placed backside up therein such that the backside of the circuit component forms a portion of the substantially regular surface.

In accordance with another aspect of the present invention, there is provided an apparatus for use in assembling an electronic device. The apparatus includes a fixture that has a first surface and a second surface. The first surface has a plurality of holders. Each of the plurality of holders are sized to accept a circuit component placed backside up therein such that the backside of each circuit component is placed in a substantially coplanar relationship.

In accordance with yet another aspect of the present invention, there is provided an apparatus for use in assembling an electronic device. The apparatus includes a first fixture that has a first surface which is substantially regular and that has a plurality of first recesses therein arranged in a given pattern. Each of the plurality of recesses is sized to accept a circuit component placed backside up therein such that the backside of each circuit component is placed in a substantially coplanar relationship. A second fixture has a second surface that is substantially regular and that has a plurality of second recesses therein arranged in a mirror image of the given pattern. The second surface of the second fixture is adapted to mate with the first surface of the first fixture to transfer the plurality of circuit components from the first recesses of the first fixture to the second recesses of the second fixture, wherein each of the plurality of second recesses is sized to accept one of the respective circuit components placed right side up therein.

In accordance with a further aspect of the present invention, there is provided an apparatus for use in assembling an electronic device. The apparatus includes a fixture that has a first surface and a second surface. The first surface is substantially regular and has a plurality of recesses therein. Each of the plurality of recesses is sized to accept a circuit component placed backside up therein such that the backside of each circuit component is placed in a substantially coplanar relationship. A device, such as a screen printer, applies adhesive to the backside of each of the circuit components in the fixture.

In accordance with an even further aspect of the present invention, there is provided an apparatus for use in assembling an electronic device. The apparatus includes: means for holding a plurality of circuit components backside up such that the backside of each circuit component is placed in a substantially coplanar relationship; means for applying adhesive to the backside of each of the circuit components while in the holding means; and means for receiving each of the circuit components from the holding means and supporting the circuit components in a right side up position.

In accordance with a still further aspect of the present invention, there is provided a method of assembling an electronic device. The method includes the acts of: (a) holding a plurality of circuit components backside up such that the backside of each circuit component is placed in a substantially coplanar relationship; (b) applying adhesive to the backside of each of the circuit components; and (c) supporting the circuit components in a right side up position after the adhesive has been applied.

In accordance with a yet further aspect of the present invention, there is provided an apparatus for use in assembling an electronic device. The apparatus includes a first fixture that has a plurality of first holders arranged in a given pattern. Each of the plurality of first holders is configured to hold a circuit component placed backside up therein such that the backside of each circuit component is placed in a substantially coplanar relationship. A second fixture has a plurality of second holders arranged in a mirror image of the given pattern. The second fixture is adapted to mate with the first fixture to transfer the plurality of circuit components from the first holders of the first fixture to the second holders of the second fixture, wherein each of the plurality of second holders is configured to hold one of the respective circuit components placed right side up therein.

BRIEF DESCRIPTION OF THE DRAWINGS

The foregoing and other advantages of the invention will become apparent upon reading the following detailed description and upon reference to the drawings in which:

FIG. 9 illustrates the cross-sectional view of FIG. 8 with the complementary fixture positioned on the main fixture;

FIG. 10 illustrates a cross-sectional view of the main fixture positioned on the complementary fixture;

FIG. 11 illustrates a cross-sectional view of the complementary fixture holding the circuit components;

FIG. 12 illustrates the cross-sectional view of FIG. 11 with a pick and place apparatus for removing the circuit components from the complementary fixture;

DESCRIPTION OF SPECIFIC EMBODIMENTS

As discussed in detail below in conjunction with the drawings, the methods and apparatus for assembling electronic devices may be used on a variety of regular or irregular substrates. However, a cardiac stimulator is presented below as one example of an electronic device that may benefit from the method and apparatus disclosed herein. As is well known, a cardiac stimulator is a medical device used to facilitate heart function. For instance, if a person's heart does not beat properly, a cardiac stimulator may be used to provide relief. The cardiac stimulator delivers electrical stimulation to a patient's heart to keep it beating properly. In fact, cardiac stimulators generally fall into two categories, pacemakers and defibrillators, although some cardiac stimulators may perform both functions. Pacemakers supply electrical pulses to the heart to keep the heart beating at a desired rate, while defibrillators supply a relatively large electrical pulse to the heart to help the heart recover from cardiac failure.

Figure 1:
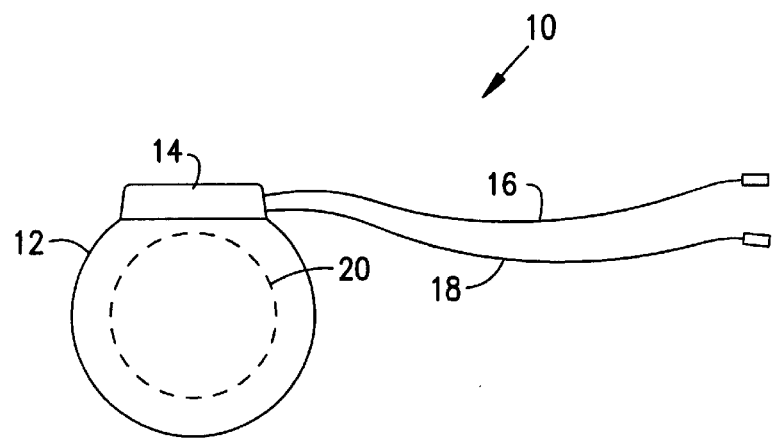
FIG. 1 illustrates a cardiac stimulator.

Turning now to the drawings, and referring initially to FIG. 1, a cardiac stimulator is illustrated and generally designated by a reference numeral 10. The body of the cardiac stimulator 10 typically includes a case 12 and a header 14. One or more leads, such as an atrial lead 16 and a ventricular lead 18, are typically coupled to the header 14 to transmit electrical stimulation pulses to the patient's heart. The electrical stimulation pulses are generated by electronic circuitry 20 contained within the case 12 of the cardiac stimulator 10. The cardiac stimulator 10 also uses the electronic circuitry 20 to perform its other functions, so the circuitry 20 typically includes a microprocessor that is coupled to a variety of circuits, such as a memory, stimulus generators, and sense circuits.

Figure 2:
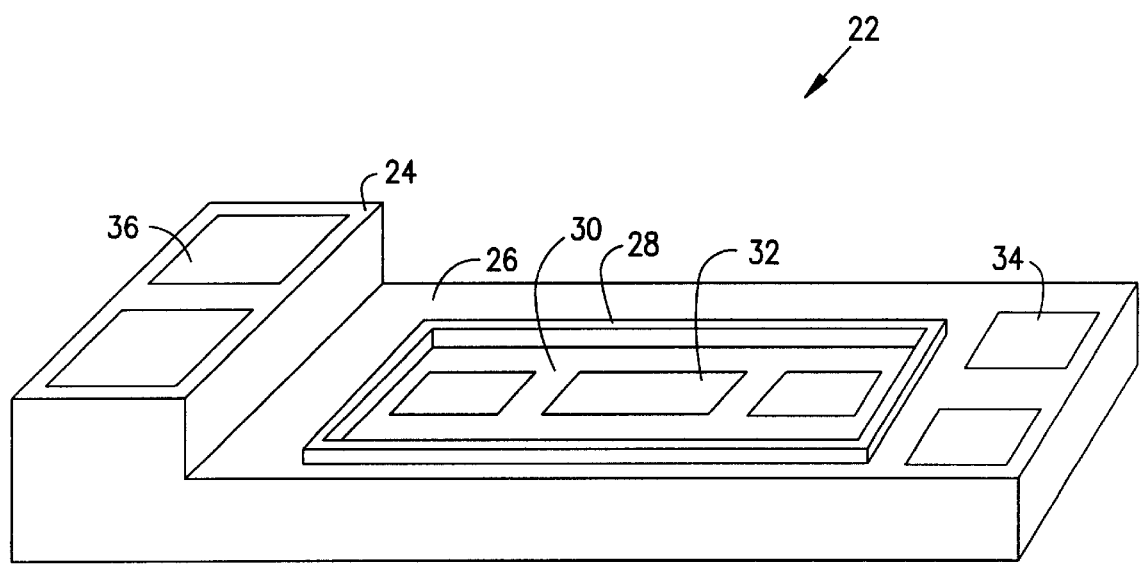
FIG. 2 illustrates a perspective view of a portion of an uneven substrate.

The microprocessor and related circuitry are typically mounted on a substrate. A portion of one such substrate is illustrated in FIG. 2 and designated by the reference numeral 22. As mentioned previously, certain substrates include multiple levels, ridges, or cavities. The exemplary portion of the substrate 22 features a multi-level surface that includes an upper surface 24 and a lower surface 26. The lower surface 26 features a ring 28 that extends upwardly from the surface 26 effectively to define a cavity 30 on the lower surface 26.

Circuit components 32 may be mounted within the cavity 30 to isolate them from other circuit components 34 and 36. For example, the circuit components 32 may be more sensitive to environmental conditions than the circuit components 34 and 36. Accordingly, the circuit components 32 may be mounted within the cavity 30 so that they may be hermetically sealed, while leaving the circuit components 34 and 36 unsealed.

As discussed previously, known screen printing techniques are relatively ineffective on substrates that have irregular surfaces, such as the substrate 22, and the use of dispensing machines has a number of drawbacks. To address these concerns, it has been determined that a rather conventional screen printing process may be used to apply adhesive to the circuit components rather than to the substrate. Once the adhesive has been applied to the circuit components, the circuit components may be transferred to the substrate for mounting in the desired locations.

Figure 3:
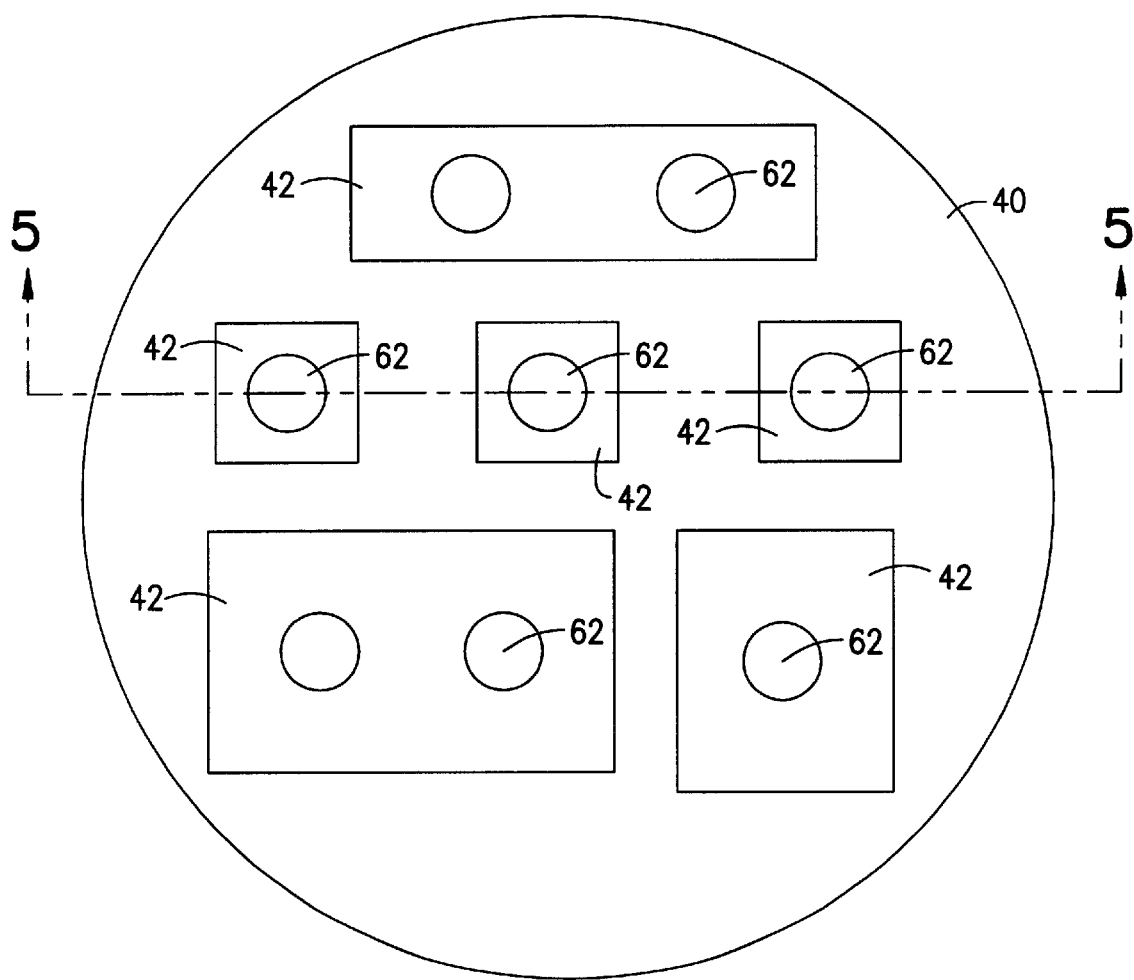
FIG. 3 illustrates a top view of one exemplary fixture in accordance with the present invention.
Figure 4:
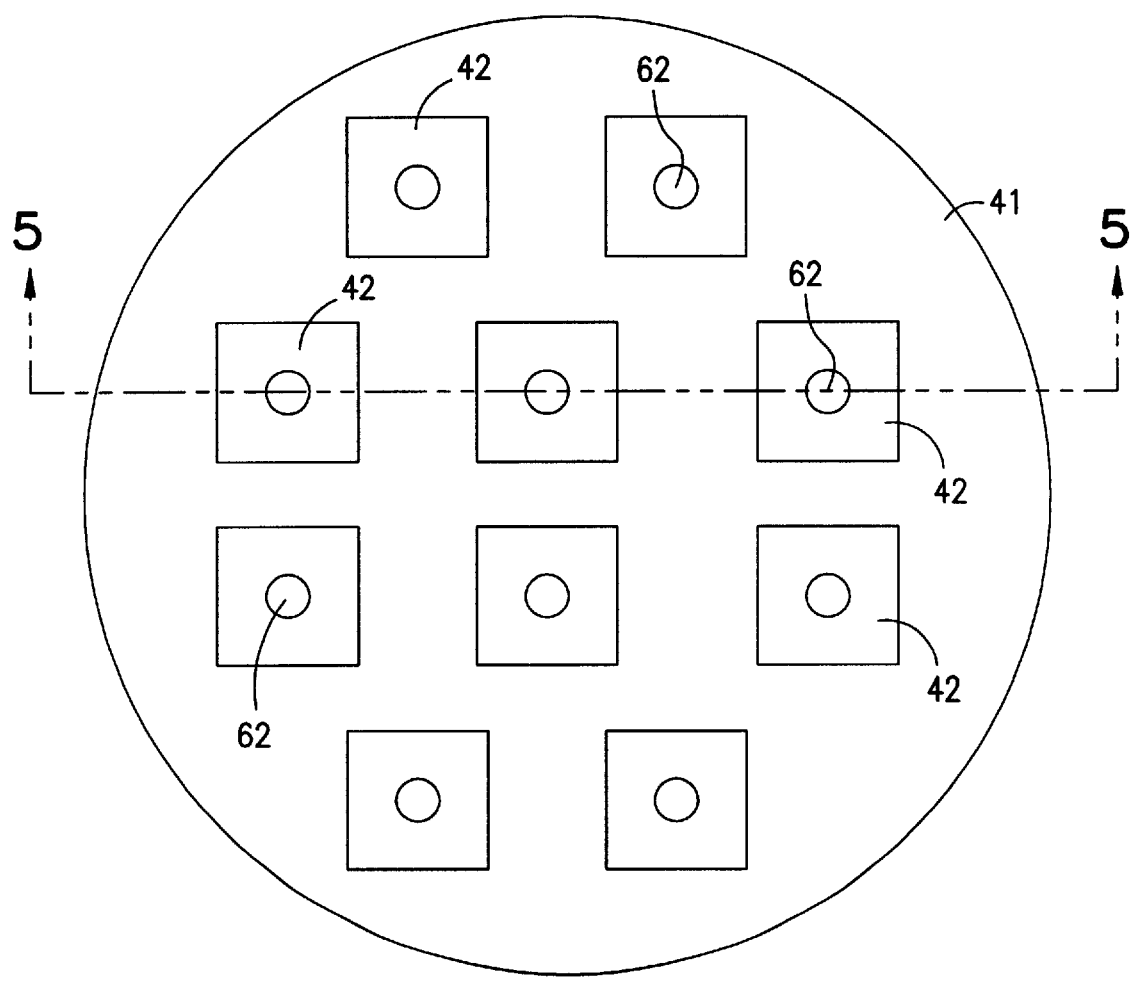
FIG. 4 illustrates a top view of another exemplary fixture in accordance with the present invention.

To facilitate the use of a screen printing process for applying adhesive to circuit components, a fixture is provided for holding the circuit components during the screen printing process. One example of a fixture is illustrated in FIG. 3 and designated by the reference numeral 40. As can be seen, the fixture 40 includes a number of recesses 42 of various shapes and sizes. The fixture 40 may be particularly useful to contain all of the circuit components for use in a single electronic device. Alternatively, FIG. 4 illustrates a fixture 41 that includes a number of recesses 42 of the same shape and size. The fixture 41 may be particularly useful to hold many of the same type of circuit components to be used in assembling several electronic devices. As will be appreciated from the following discussion, the fixture 40 may be particularly useful in relatively low volume production operations, while the fixture 41 may be particularly useful in relatively high volume production operations.

The fixtures 40 and 41 may be made out of any suitable material. For instance, it may be advantageous for the fixture to protect circuit components such as chips and surface mount packages. Accordingly, the fixtures 40 and 41 may be made of a material that dissipates static electricity, such as anodized aluminum or conductive plastic. Alternatively, other materials, such as stainless steel, ceramic, glass, or polymers, may be appropriate in certain circumstances. Additionally, it may be advantageous to make the fixtures 40 and 41 from a material that is machinable or moldable.

Figure 5:
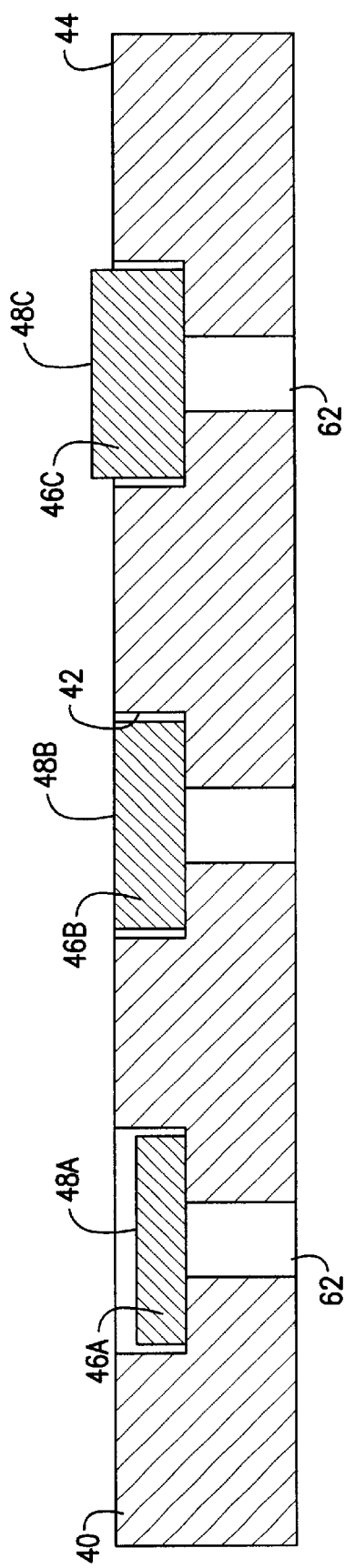
FIG. 5 illustrates a cross-sectional view of the fixture of FIG. 3 taken along line 5—5, along with circuit components disposed in the recesses of the fixture.

Referring now to the cross-sectional view of the fixture 40 illustrated in FIG. 5, it should be appreciated that the following comments apply to the fixture 41 as well. It can be seen that the fixture 40 has a relatively smooth and regular surface 44, although the fixture 40 advantageously includes one or more recesses 42 that are sized to accept the particular circuit components 46. Precise placement of the circuit components 46 within the recesses 42 is important, both so that adhesive can be accurately applied to the components and so that the components can be inverted into a complementary fixture without adhering to the complementary fixture. Both of these steps will be described in more detail below. Preferably, however, the opening of a recess should be no more than 0.5 mil (0.01 mm) larger than the associated component in any linear direction in the plane of the regular surface 44. The circuit components 46 reside within the recesses 42 so that they essentially form a portion of the substantially regular surface of the fixture 40. Ideally, the exposed surfaces 48 of the circuit components 46 are disposed in a coplanar relationship with the surface 44 of the fixture 40, as illustrated by the circuit component 46b. However, the exposed surfaces of the circuit components 46 may also be slightly offset with respect to the surface 44 of the fixture 40 to provide at least a substantially coplanar relationship, depending upon the tolerance of the screen printing process to be used. For example, the surface 48a of the circuit component 46a is slightly recessed relative to the surface 44 of the fixture 40, while the surface 48c of the circuit component 46c is slightly raised with respect to the surface 44 of the fixture 40. Generally speaking, a tolerance of +/−2 to +/−5 mils (+/−0.05 mm to 0.128 mm) is acceptable for most screen printing processes.

Figure 6:
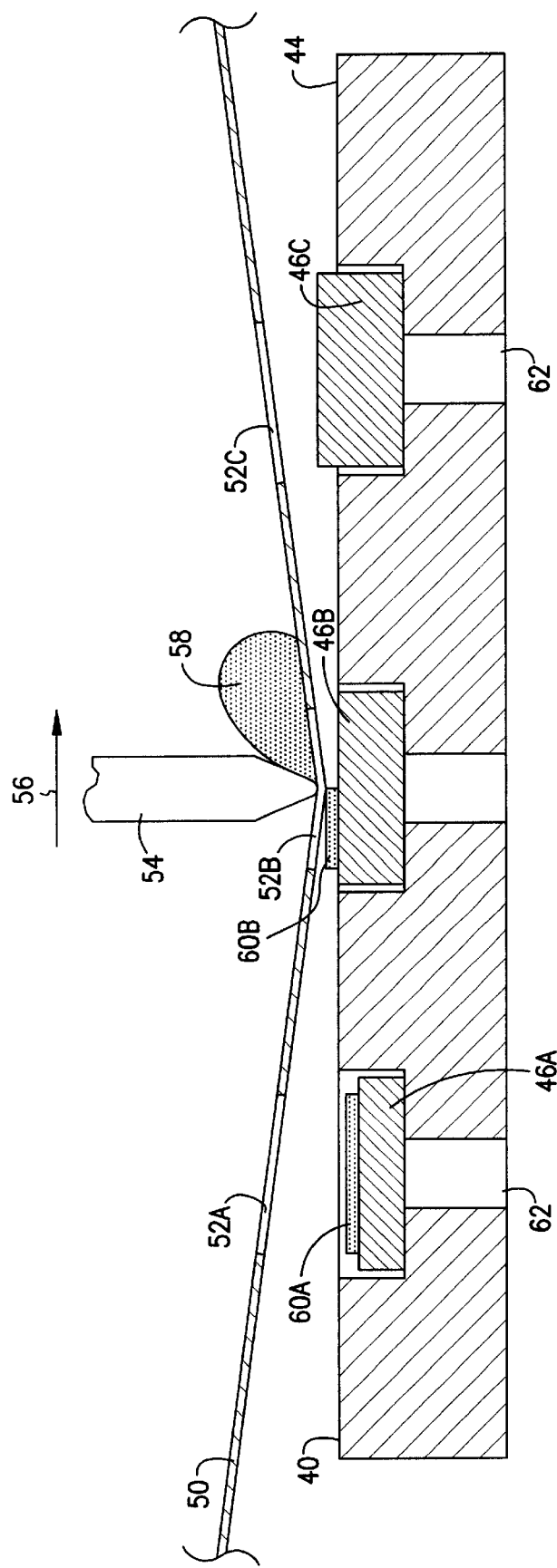
FIG. 6 illustrates the cross-sectional view of FIG. 5 during a screen printing process.

The circuit components 46 are positioned upside down in the fixture 40 so that the adhesive may be applied to the backside of the circuit components 46. The edges of the recesses 42 may be chamfered slightly to facilitate insertion of the circuit components 46 within the recesses 42. Once the circuit components 46 have been inserted into the fixture 40, the fixture 40 is positioned underneath a screen 50 of a screen printer. As illustrated in FIG. 6, the screen includes an impermeable template or gel shield which has holes 52a, 52b, and 52c that are positioned over the circuit components 46a, 46b, and 46c, respectively. The holes may be slightly smaller than the corresponding exposed surface 48 of a circuit component 46. As the squeegee 54 moves in the direction of the arrow 56, it brings the screen 50 into closer proximity with the exposed surfaces 48 of the circuit components 46 while it moves the selected adhesive material 58 along the screen 50. In this example, a layer of adhesive 60a is illustrated as being deposited on the exposed surface 48a of the circuit component 46a, and a second layer of adhesive 60b is in the process of being deposited on the exposed surface 48b of the circuit component 46b.

It should be appreciated that if the circuit components 46 are not held within the recesses 42 during the screen printing process that the application of adhesive may tend to pull the circuit components 46 out of the recesses 42. Accordingly, it is advantageous to provide a means of holding the circuit components 46 within the recesses 42 of the fixture 40. In the illustrated embodiment, each recess 42 is provided with one or more holes 62 which extend between the bottom of the recess 42 and the bottom of the fixture 40. A vacuum may be applied through the holes 62 to hold the circuit components 46 within the recesses 42 during the screen printing process. Other suitable means for holding the circuit components 46 within the recesses 42 may also be employed. For instance, a tacky substance, such as gel coat, may be disposed in the recesses 42 to hold the circuit components 46 temporarily during the application of adhesive. Alternatively, the circuit components 46 may be held to the fixture 40 by a suitable mechanical clamping device.

Figure 7:
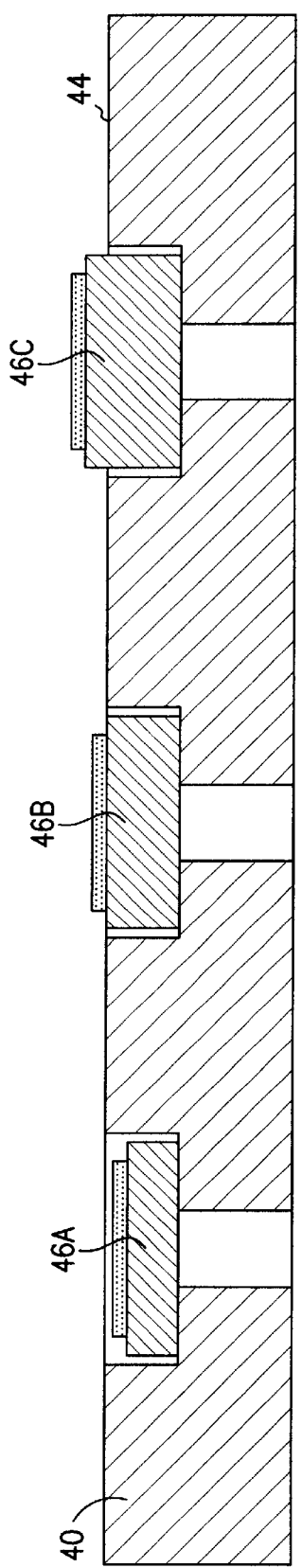
FIG. 7 illustrates the cross-sectional view of FIG. 6 after deposition of adhesive on the circuit components.
Figure 8:
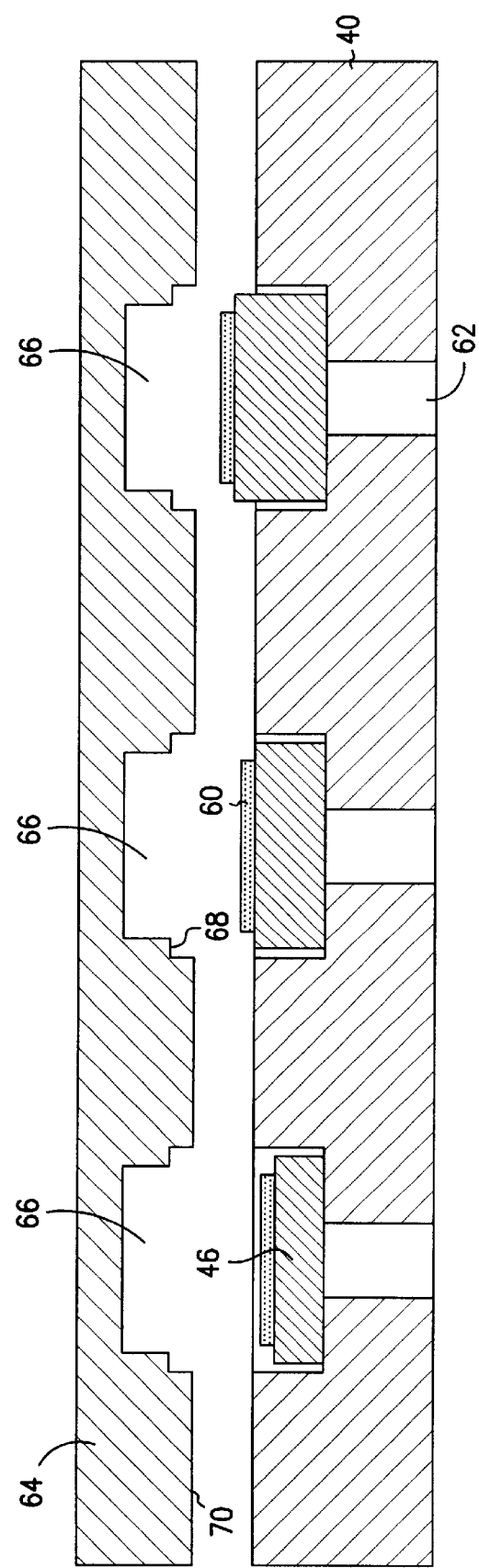
FIG. 8 illustrates the cross-sectional view of FIG. 7 with an exemplary complementary fixture positioned over the main fixture.

FIG. 7 illustrates the circuit components 46 residing in the fixture 40 after the adhesive 60 has been applied to all of the circuit components 46. To place the circuit components 46 in a position that facilitates the transfer of the circuit components 46 to a substrate, such as the substrate 22, a complementary fixture 64 is positioned over the main fixture 40, as illustrated in FIG. 8. The complementary fixture 64 includes a number of recesses 66 that are patterned in essentially the mirror image of the recesses 42 in the main fixture 40. In this embodiment, each of the recesses 66 includes a peripheral shoulder 68. The outer periphery of each recess 66 adjacent the surface 70 of the complementary fixture 64 is sized to accept the respective circuit component 46, while each shoulder 68 is sized to contact an edge surface of the respective circuit component 46 where adhesive has not been deposited. Each shoulder 68 may extend around the entire periphery of the recess 66, or each shoulder 68 may extend into only certain portions of the recess 66 corresponding to areas on the exposed surface 48 of the circuit component 46 which have not been coated with adhesive. The remainder of each recess 66 is deep enough so as not to contact the adhesive 60 which has been applied to the circuit components 46.

After the complementary fixture 64 has been aligned over the main fixture 40—a procedure which may take place by hand or by the use of a suitable machine such as a robotic mechanism—the complementary fixture 64 is lowered into contact with the main fixture 40, as illustrated in FIG. 9. The fixtures 40 and 64 may include alignment pins, keys, or other suitable registration means (not shown) to facilitate this process. Furthermore, this mating of the fixtures 40 and 64 may occur while the vacuum continues to hold the circuit components 46 within the recesses 42, or it may occur after the vacuum has been turned off.

While in contact, the assembly is flipped over so that the main fixture 40 resides on top of the complementary fixture 64, as illustrated in FIG. 10. The contact between the fixtures 40 and 64 may be maintained by hand or by the use of suitable clamps during this transition. As above, the flipping of the fixtures 40 and 64 may occur while the vacuum continues to hold the circuit components 46 within the recesses 42, or it may occur after the vacuum has been turned off.

The complementary fixture 64 now holds the circuit components 46 right side up, with the edge surfaces of the circuit components 46 being supported by the shoulder 68 of the respective recess 66. The vacuum, if any, may be turned off, and the main fixture 40 may then be removed to expose the top side of the circuit components 46, as illustrated in FIG. 11. Once the main fixture 40 has been removed so that the complementary fixture 64 is holding the circuit components 46 right side up, the circuit components 46 may be transferred to the surface of the substrate 22. As illustrated in FIG. 12, for example, a pick and place device 72 may be used to transfer the circuit components 46 from the complementary fixture 64 to the substrate 22. A suitable pick and place device is a Model SOS available from MRSI, LHEIMSFORO, Mass.

Although the complementary fixture 64 performs quite well, it should be noted that the use of the shoulders 68 of the recesses 66 to support the circuit components may preclude applying the adhesive 60 out to the edge of each circuit component 46, as noted above. This may be particularly true if the shoulder 68 extends around the entire periphery of the recess 66, but also if the shoulder 68 only projects into the recess 66 at certain locations.

Figure 13:
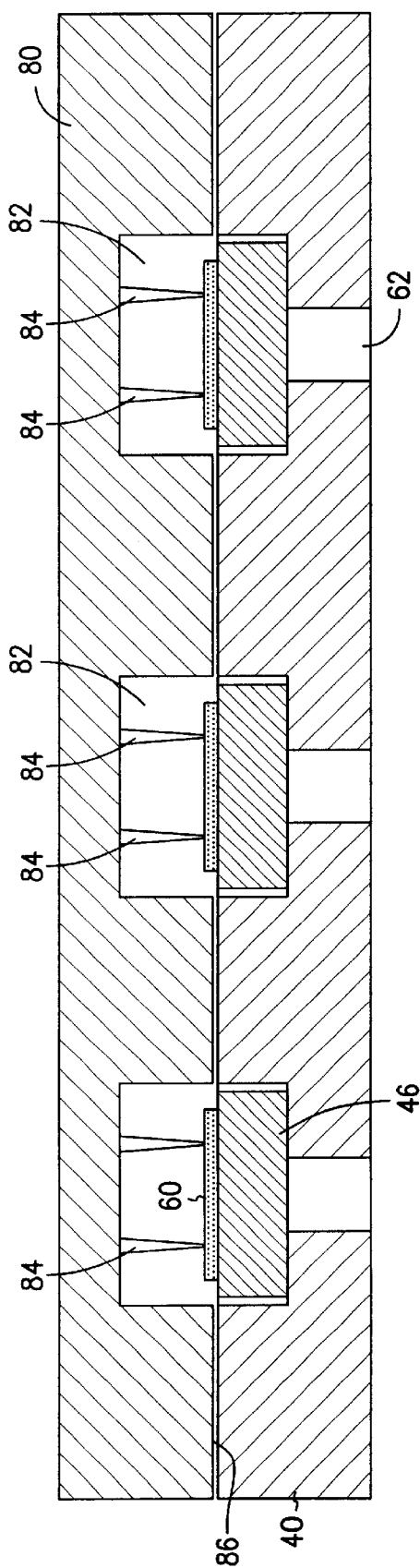
FIG. 13 illustrates a cross-sectional view of an alternative embodiment of a complementary fixture positioned on the main fixture of FIG. 7.
Figure 14:
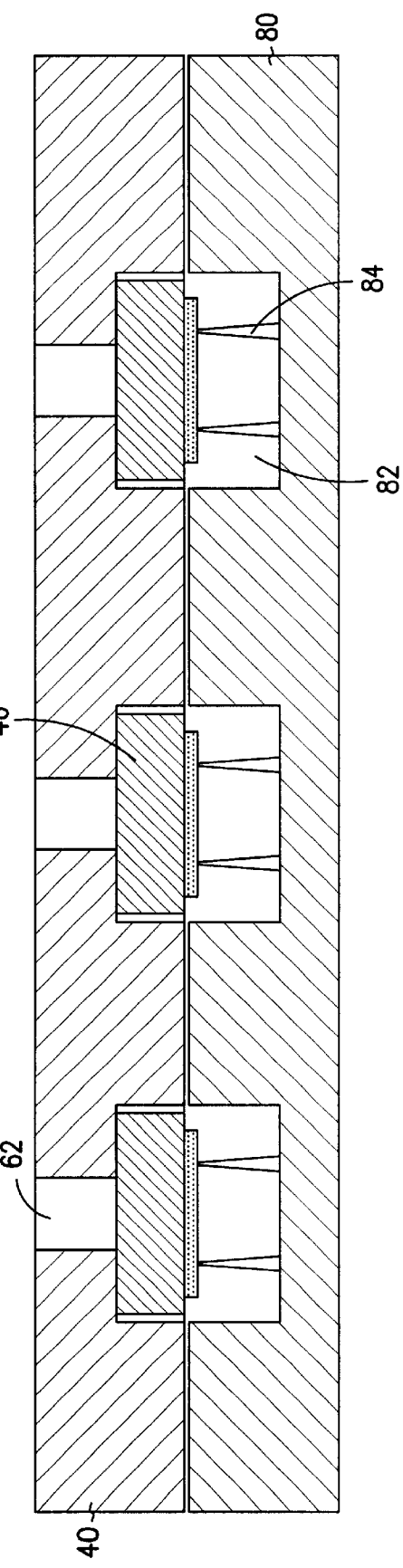
FIG. 14 illustrates a cross-sectional view of the main fixture positioned on the complementary fixture of FIG. 13.
Figure 15:
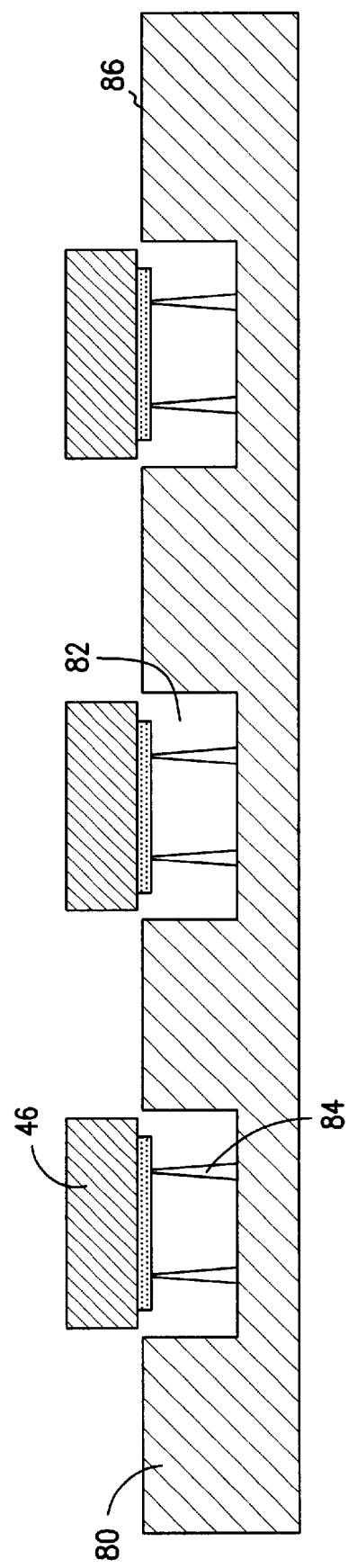
FIG. 15 illustrates a cross-sectional view of the complementary fixture of FIG. 13 holding the circuit components.

To address this concern, an alternate complementary fixture 80 is contemplated, as illustrated in FIGS. 13–15. The complementary fixture 80 includes recesses 82 that are substantially the same as the recesses 66 of the complementary fixture 64. However, instead of using shoulders to support the circuit components 46, the complementary fixture 80 includes pins 84 that extend from the bottom of each recess 82 toward the surface 86 of the fixture 80. When the complementary fixture 80 is aligned and positioned on the fixture 40, as illustrated in FIG. 13, the ends of the pins 84 are positioned adjacent the back side of each of the respective circuit components 46. Once the assembly has been flipped over so that the main fixture 40 resides on top of the complementary fixture 80, as illustrated in FIG. 14, the complementary fixture 80 holds the circuit components 46 right side up, with the back side of each circuit component 46 being supported by the pins 84 of the respective recess 82. To provide proper support, each recess advantageously includes at least three pins 84, although a greater number may be used as the size of the circuit components 46 increase.

As in the previous embodiment, the main fixture 40 may then be removed to expose the top side of the circuit components 46, as illustrated in FIG. 15. Once the main fixture 40 has been removed so that the complementary fixture 80 is holding the circuit components 46 right side up, the circuit components 46 may be transferred to the surface of the substrate 22 using the pick and place device 72 described earlier.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An apparatus for use in assembling an electronic device comprising:

a fixture having a substantially regular surface, the substantially regular surface having a plurality of recesses therein, each of the plurality of recesses adapted to accept a circuit component backside up therein such that the backside of the circuit component forms a portion of the substantially regular surface; and a device adapted to apply adhesive comprising a screen printer having a screen located over the fixture, the screen carrying a template having a plurality of holes therein, each hole located over a respective one of the circuit components to facilitate application of adhesive onto the backside of each circuit component through each respective hole.

2. The apparatus as set forth in claim 1, wherein the backside of each circuit component is offset by no more than approximately 0.127 mm (0.005 inches) from the substantially regular surface of the fixture.

3. The apparatus, as set forth in claim 1, wherein the recesses are no more than 0.0127 mm (0.0005 inches) larger than the component to be received therein any linear direction in the plane of the regular surface.

4. An apparatus for use in assembling an electronic device comprising:

a fixture having a substantially regular first surface and a second surface, the first surface comprising a plurality of holders, each of the plurality of holders adapted to accept a circuit component backside up therein such that the backside of the circuit components are in a substantially coplanar relationship with the first surface; and a device adapted to apply adhesive comprising a screen printer having a screen located over the fixture, the screen carrying a template having a plurality of holes therein, each hole located over a respective one of the circuit components to facilitate application of adhesive onto the backside of each circuit component through each respective hole.

5. The apparatus, as set forth in claim 1, wherein the fixture is anodized aluminum.

6. The apparatus, as set forth in claim 1, wherein the fixture is conductive plastic.

7. The apparatus, as set forth in claim 4, wherein each of the plurality of holders has a respective hole which extends through the second surface, each hole supplying a vacuum to the respective holder for holding the respective circuit component in the holder.

8. An apparatus for use in assembling an electronic device comprising:

a first fixture having a substantially regular first surface, the first surface comprising a plurality of first recesses therein arranged in a given pattern, each of the plurality of recesses adapted to accept a circuit component backside up therein such that the backside of the circuit components are in a substantially coplanar relationship;

a second fixture having a second surface, the second surface comprising a plurality of second recesses therein arranged in a mirror image of the given pattern, the second surface of the second fixture adapted to mate with the first surface, wherein each of the plurality of second recesses is adapted to accept one of the respective circuit components right side up therein; and a device adapted to apply adhesive comprising a screen printer having a screen located over the first fixture, the screen carrying a template having a plurality of holes therein, each hole located over a respective one of the circuit components to facilitate application of adhesive onto the backside of each circuit component through each respective hole.

9. The apparatus, as set forth in claim 8, wherein each of the plurality of first recesses has a respective hole which extends through the first fixture, each hole supplying a vacuum to the respective first recess for holding the respective circuit component within the first recess.

10. The apparatus, as set forth in claim 8, wherein each of the second recesses comprises a shoulder to support the respective circuit component.

11. The apparatus, as set forth in claim 10, wherein each respective shoulder extends completely about a periphery of the respective second recess.

12. The apparatus, as set forth in claim 10, wherein each respective shoulder extends partially about a periphery of the respective second recess.

13. The apparatus, as set forth in claim 8, wherein each of the second recesses comprises a plurality of pins disposed within the respective recess to support the respective circuit component.

14. The apparatus, as set forth in claim 13, wherein the plurality of pins in each respective second recess extend upwardly from a bottom of the respective second recess and terminate adjacent a top of the respective second recess.

15. An apparatus for use in assembling an electronic device comprising:
   a fixture having a substantially regular first surface and a second surface;
   a plurality of recesses extending from the first surface, each of the plurality of recesses adapted to accept a circuit component backside up therein such that the backside of each circuit component is in a substantially coplanar relationship with the first surface; and
   a device adapted to apply adhesive to the backside of each of the circuit components in the fixture, the device comprising a screen printer having a screen located over the fixture, the screen carrying a template having a plurality of holes therein, each hole located over a respective one of the circuit components to facilitate application of adhesive onto the backside of each circuit component through each respective hole.

16. The apparatus of claim 15, wherein each of the plurality of recesses has a respective hole which extends through the second surface, each hole adapted to supply a vacuum to the respective recess for holding the respective circuit component within the recess.

17. An apparatus for use in assembling an electronic device comprising:
   means for holding a plurality of circuit components backside up such that the backside of the circuit components are in a substantially coplanar relationship;
   means for applying adhesive to the backside of each of the circuit components while in the holding means wherein the adhesive is applied using a device comprising a screen printer having a screen located over the means for holding, the screen carrying a template having a plurality of holes therein, each hole located over a respective one of the circuit components to facilitate application of adhesive onto the backside of each circuit component through each respective hole; and
   means for receiving each of the circuit components from the holding means and supporting the circuit components in a right side up position.

18. A method of assembling an electronic device, the method comprising:
   holding a plurality of circuit components backside up in a first fixture having a substantially regular surface such that the backside of the circuit components are in a substantially coplanar relationship;
   applying adhesive to the backside of each circuit component;
   supporting the circuit components in a right side up position after the adhesive has been applied;
   moving the circuit components to a circuit board; and
   securing the circuit components to the circuit board with the adhesive, wherein the adhesive is applied using a device, the device comprising a screen printer having a screen located over the fixture, the screen carrying a template having a plurality of holes therein, each hole located over a respective one of the circuit components to facilitate application of adhesive onto the backside of each circuit component through each respective hole.

19. The method of claim 18, wherein holding a plurality of circuit components backside up comprises offsetting the backside of each circuit component by no more than approximately 0.127 mm (0.005 inches) from the substantially regular surface.

20. The method of claim 18, wherein holding a plurality of circuit components backside up comprises placing each of the plurality of circuit components in a respective first recess of a plurality of first recesses which extend from the substantially regular surface of the first fixture.

21. The method of claim 20, wherein holding a plurality of circuit components backside up further comprises holding the circuit components in the respective first recess using a vacuum.

22. The method of claim 19, wherein applying adhesive to the backside of each circuit component comprises:
   positioning a screen of a screen printer over the backsides of the circuit components, the screen carrying a template having a plurality of holes therein, each hole located over a respective one of the circuit components; and
   applying adhesive onto the backside of each circuit component through each respective hole.

23. An apparatus for use in assembling an electronic device comprising:
   a first fixture having a substantially regular first surface, the first fixture comprising a plurality of first holders depending from the first surface, the first holders arranged in a given pattern, each of the plurality of first holders adapted to hold a circuit component backside up therein such that the backside of the circuit components are in a substantially coplanar relationship;
   a second fixture having a second surface, the second surface comprising a plurality of second holders arranged in a mirror image of the given pattern, the second surface adapted to mate with the first surface, wherein each of the plurality of second holders is adapted to accept one of the respective circuit components right side up therein; and
   a device adapted to apply adhesive comprising a screen printer having a screen located over the first fixture, the screen carrying a template having a plurality of holes therein, each hole located over a respective one of the circuit components to facilitate application of adhesive onto the backside of each circuit component through each respective hole.

24. The apparatus, as set forth in claim 23, wherein each of the plurality of first holders comprises means for holding the respective circuit component within the first holder.

25. The apparatus, as set forth in claim 23, wherein each of the first holders comprises a first recess depending from the first surface of the first fixture, and wherein each of the second holders comprises a second recess depending from the second surface of the second fixture.

26. The apparatus, as set forth in claim 25, wherein the first recesses are no more than approximately 0.0127 mm (0.0005) larger than the component to be received therein in any linear direction in the plane of the first surface.

27. The apparatus, as set forth in claim 25, wherein the backside of each circuit component is offset by no more than approximately 0.127 mm (0.005 inches) from the first surface.

28. The apparatus of claim 8, wherein the backside of each circuit component is offset by no more than approximately 0.127 mm (0.005 inches) from the first surface.

29. The apparatus of claim 8, wherein the recesses are no more than approximately 0.0127 mm (0.005 inches) larger than the component to be received therein in any linear direction in the plane of the regular surface.

30. The apparatus of claim 8, further comprising:
the plurality of first recesses adapted to accept a circuit component backside up therein such that the backside of each circuit component is in a substantially coplanar relationship with the first surface.

31. The apparatus of claim 8, wherein one or both of the first and second fixtures are anodized aluminum.

32. The apparatus of claim 8, wherein one or both of the first and second fixtures are conductive plastic.

33. The apparatus, as set forth in claim 24, wherein means for holding comprises a vacuum, wherein each of the plurality of first holders has a respective hole which extends through the first fixture, each hole supplying a vacuum to the respective first holder for holding the respective circuit component in the first holder.

34. The apparatus, as set forth in claim 23, wherein each of the second holders comprises a shoulder to support the respective circuit component.

35. The apparatus, as set forth in claim 34, wherein each respective shoulder extends completely about a periphery of the respective second holder.

36. The apparatus, as set forth in claim 34, wherein each respective shoulder extends partially about a periphery of the respective second holder.

37. The apparatus, as set forth in claim 23, wherein each of the second holders comprises a plurality of pins depending from a bottom of the respective second holder adapted to support the respective circuit component.

38. A method of assembling an electronic device, the method comprising:
holding a plurality of circuit components backside up in a first fixture, the first fixture comprising a substantially regular first surface having a plurality of first holders therein arranged in a given pattern, each of the plurality of first holders adapted to accept a circuit component backside up therein such that the backsides of the circuit components are substantially coplanar;
applying adhesive to the backside of each circuit component, wherein the adhesive is applied using a device comprising a screen printer having a screen located over the first fixture, the screen carrying a template having a plurality of holes therein, each hole located over a respective one of the circuit components to facilitate application of adhesive onto the backside of each circuit component through each respective hole;
mating a second surface of a second fixture with the first surface, the second surface comprising a plurality of complementary second holders therein arranged in a mirror image of the given pattern, the second holders aligned with the complementary first holders, the second holders adapted to receive the respective circuit components right side up therein;
transferring the circuit components from the first fixture to the second fixture by inverting the mated first and second fixtures such that the second fixture is below the first fixture;
supporting the circuit components in a right side up position within the respective second holders;
unmating the first fixture from the second fixture;
moving the circuit components to one or more circuit boards; and
securing the circuit components to the one or more circuit boards with the adhesive.

39. The method according to claim 38, wherein supporting the circuit components in a right side up position within the second holders comprises supporting at least a portion of the periphery of the respective circuit component on a shoulder disposed within the respective second holder.

40. The method according to claim 38, wherein supporting the circuit components in a right side up position within the second holders comprises supporting the backside of the respective circuit component on a plurality of pins depending from a bottom of the respective second holder.

41. The method according to claim 38, wherein each of the plurality of first holders are adapted such that the backsides of the circuit components forms a portion of the first surface.

42. The method according to claim 41, wherein using a silkscreen process to apply adhesive to the backside of each circuit component comprises:
positioning a screen of a screen printer over the fixture, the screen having a plurality of holes therein;
locating each hole over a respective one of the circuit components; and
applying adhesive onto the backside of each circuit component through each respective hole.

43. A method of assembling an electronic device, the method comprising:
holding a plurality of circuit components backside up in a first fixture, the first fixture comprising a substantially regular first surface having a plurality of recesses therein arranged in a given pattern, each of the plurality of recesses adapted to accept a circuit component backside up therein such that the backsides of the circuit component are substantially coplanar;
applying adhesive to the backside of each circuit component, wherein the adhesive is applied using a device comprising a screen printer having a screen located over the first fixture, the screen carrying a template having a plurality of holes therein, each hole located over a respective one of the circuit components to facilitate application of adhesive onto the backside of each circuit component through each respective hole;
mating a second surface of a second fixture with the first surface, the second surface comprising a plurality of complementary second recesses therein arranged in a mirror image of the given pattern, the second recesses aligned with the complementary first recesses, the second recesses adapted to receive the respective circuit components right side up therein;
transferring the circuit components from the first fixture to the second fixture by inverting the mated first and second fixtures such that the second fixture is below the first fixture;

supporting the circuit components in a right side up position within the second recesses;

unmating the first fixture from the second fixture;

moving the circuit components to one or more circuit boards; and securing the circuit components to the one or more circuit boards with the adhesive.

44. The method according to claim 43, wherein supporting the circuit components in a right side up position within the second recesses comprises supporting at least a portion of the periphery of the respective circuit component on a shoulder disposed within the respective second recess.

45. The method according to claim 42, wherein each of the plurality of recesses adapted to accept a circuit component backside up therein such that the backsides of the circuit components are substantially coplanar with the substantially regular surface.

46. The method according to claim 46, wherein using a silkscreen process to apply adhesive to the backside of each circuit component comprises:

positioning a screen of a screen printer over the fixture, the screen having a plurality of holes therein;

locating each hole over a respective one of the circuit components; and applying adhesive onto the backside of each circuit component through each respective hole.

* * * * *